(12) United States Patent
Park et al.

(10) Patent No.: US 10,001,875 B2
(45) Date of Patent: Jun. 19, 2018

(54) TOUCH PANEL AND METHOD OF FABRICATING THE SAME

(71) Applicant: Samsung Display Co. Ltd., Yongin-si, Gyeonggi-Do (KR)

(72) Inventors: Sung Kyun Park, Suwon-si (KR); Cheol Kyu Kim, Seoul (KR); Ki Hyun Cho, Suwon-si (KR); Sun Haeng Cho, Hwaseong-si (KR); Kyung Seop Kim, Hwaseong-si (KR); Jae Neung Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days. days.

(21) Appl. No.: 15/645,383

(22) Filed: Jul. 10, 2017

(65) Prior Publication Data
US 2017/0308232 A1    Oct. 26, 2017

Related U.S. Application Data

(62) Division of application No. 14/673,367, filed on Mar. 30, 2015, now Pat. No. 9,733,750.

(30) Foreign Application Priority Data

Dec. 2, 2014 (KR) .................. 10-2014-0170603

(51) Int. Cl.
*C23F 1/00* (2006.01)
*G06F 3/041* (2006.01)
(Continued)

(52) U.S. Cl.
CPC ........ *G06F 3/0416* (2013.01); *G06F 3/03547* (2013.01); *G06F 3/041* (2013.01);
(Continued)

(58) Field of Classification Search
CPC .... G06F 3/041; G06F 3/0416; G06F 3/03547; G06F 2203/04111; G06F 2203/04103; H01L 31/1888
(Continued)

(56) References Cited

U.S. PATENT DOCUMENTS

2010/0261119 A1    10/2010 Li et al.
2011/0069033 A1    3/2011 Meng et al.
(Continued)

FOREIGN PATENT DOCUMENTS

KR        10-1169079       11/2006
KR    10-2009-0045884        5/2009
(Continued)

*Primary Examiner* — Binh X Tran
(74) *Attorney, Agent, or Firm* — Innovation Counsel, LLP

(57) ABSTRACT

A touch panel and a method of fabricating the same are provided. The touch panel may include: a substrate; first sensing electrodes disposed on a first surface and arranged along a first direction and second sensing electrodes arranged along a second direction; at least one first connector connecting the first sensing electrodes in the first direction; a first insulating layer pattern disposed on the first connector; at least one second connector disposed on the first insulating layer pattern, intersecting the first connector, and connecting the second sensing electrodes in the second direction; and wires disposed on the first surface of the substrate in the peripheral area and electrically connected to the first sensing electrodes and the second sensing electrodes. The first connector includes a first light-transmitting conductive pattern disposed on the first surface of the substrate and a first light-blocking conductive pattern disposed on the first light-transmitting conductive pattern.

9 Claims, 10 Drawing Sheets

(51) Int. Cl.
*G06F 3/044* (2006.01)
*G06F 3/0354* (2013.01)
*H01L 31/18* (2006.01)

(52) U.S. Cl.
CPC .... *G06F 3/044* (2013.01); *G06F 2203/04103* (2013.01); *G06F 2203/04111* (2013.01); *H01L 31/1888* (2013.01)

(58) Field of Classification Search
USPC .......................... 216/24, 41, 48, 49, 54, 100
See application file for complete search history.

(56) References Cited

U.S. PATENT DOCUMENTS

| | | |
|---|---|---|
| 2012/0018200 A1 | 1/2012 | Kim et al. |
| 2012/0262385 A1 | 10/2012 | Kim et al. |
| 2013/0175154 A1 | 7/2013 | Takahashi |
| 2013/0299222 A1 | 11/2013 | Lee et al. |
| 2014/0198266 A1* | 7/2014 | Park .................... G02F 1/13338 349/12 |
| 2014/0298643 A1* | 10/2014 | Li ........................ G06F 3/044 29/600 |
| 2015/0090574 A1* | 4/2015 | Lin ...................... G06F 1/1692 200/5 R |
| 2015/0145807 A1* | 5/2015 | Wang ................... G06F 3/044 345/174 |
| 2015/0167177 A1* | 6/2015 | Choi .................. H03K 17/9618 200/5 R |
| 2015/0220202 A1* | 8/2015 | Choung ............... G06F 3/0416 345/174 |
| 2016/0062518 A1* | 3/2016 | Ding .................... G06F 3/044 345/174 |
| 2016/0077434 A1* | 3/2016 | Sasahara ............... G03F 7/027 428/195.1 |

FOREIGN PATENT DOCUMENTS

| | | |
|---|---|---|
| KR | 10-2013-0098655 | 9/2013 |
| KR | 10-1389876 | 4/2014 |

\* cited by examiner

TOUCH PANEL AND METHOD OF FABRICATING THE SAME

This application is a divisional application of U.S. patent application Ser. No. 14/673,367 filed on Mar. 30, 2015, now U.S. Pat. No. 9,733,750 B2, which claims priority to Korean Patent Application No. 10-2014-0170603, filed on Dec. 2, 2014 in the Korean Intellectual Property Office (KIPO), and all the benefits accruing therefrom under 35 U.S.C. § 119, the contents of the prior applications being herein incorporated by reference.

BACKGROUND

1. Field

The inventive concept relates to a touch panel and a method of fabricating the same.

2. Description of the Related Art

Touch panels have been applied to liquid crystal display (LCD) devices and organic light-emitting diode (OLED) display devices as input devices. A touch panel is a device which allows a user to input a command by contacting the touch panel with an object such as a hand of the user or a stylus pen, etc. The touch panel recognizes a contact position by sensing a change in capacitance or voltage between two electrodes, and provides a user command corresponding to the contact position to a display device.

In general, the touch panel includes two sensing electrodes for sensing a position at which a hand or object contacts the touch panel and wiring connected to each of the two sensing electrodes. Accordingly, separate masks for forming the sensing electrodes and the wiring are needed, and a photolithography process is performed using the masks to fabricate the touch panel.

The photolithography process includes forming a photosensitive layer, exposing the photosensitive layer using a mask and developing the photosensitive layer.

However, since the photolithography process involves a series of sub-processes, it may complicate the entire fabrication of the touch panel when extra photolithography is required. Also, the removal of the exposed photosensitive layer during the photolithography process may cause pollution or defects.

SUMMARY

Exemplary embodiments of the inventive concept provide a touch panel capable of reducing the number of manufacturing processes thereof and a method of fabricating the touch panel.

However, exemplary embodiments of the inventive concept are not restricted to those set forth herein. The above and other exemplary embodiments of the inventive concept will become more apparent to one of ordinary skill in the art to which the inventive concept pertains by referencing the detailed description of the inventive concept given below.

According to an exemplary embodiment of the inventive concept, there is provided a touch panel. The touch panel includes: a substrate on which a sensing area and a peripheral area are defined; first sensing electrodes disposed on a first surface of the substrate and arranged in the sensing area along a first direction and second sensing electrodes arranged along a second direction, which intersects the first direction; at least one first connector disposed on the first surface of the substrate and connecting the first sensing electrodes in the first direction; a first insulating layer pattern disposed on the first connector; at least one second connector disposed on the first insulating layer pattern, intersecting the first connector while being insulated from the first connector, and connecting the second sensing electrodes in the second direction; and wires disposed on the first surface of the substrate in the peripheral area and electrically connected to the first sensing electrodes and the second sensing electrodes, wherein the first connector includes a first light-transmitting conductive pattern disposed on the first surface of the substrate and a first light-blocking conductive pattern disposed on the first light-transmitting conductive pattern.

According to the exemplary embodiments, it is possible to provide a method of fabricating a touch panel, which is capable of simplifying the manufacture of a touch panel, and a touch panel fabricated by the method. The method includes: forming a light-transmitting conductive layer on a first surface of a substrate; forming a light-blocking conductive layer on the light-transmitting conductive layer; forming first sensing electrodes, which are arranged along a first direction, second sensing electrodes, which are arranged along a second direction that intersects the first direction, at least one first connector, which connects the first sensing electrodes, and wires, which are connected to the first sensing electrodes and the second sensing electrodes, by patterning the light-transmitting conductive layer and the light-blocking conductive layer; removing portions of the light-blocking conductive layer that are disposed on the first sensing electrodes and the second sensing electrodes; forming a photosensitive insulating layer, which covers the first sensing electrodes, the second sensing electrodes, the first connector and the wires, on the first surface of the substrate; exposing the photosensitive insulating layer using remaining unremoved portions of the light-blocking conductive layer as a mask; removing exposed portions of the photosensitive insulating layer; forming insulating layer patterns, which cover the wires and the first connector, by thermally treating remaining unremoved portions of the photosensitive insulating layer; and forming at least one second connector, which intersects the first connector and connects the second sensing electrodes in the second direction.

Other features and exemplary embodiments will be apparent from the following detailed description, the drawings, and the claims.

DETAILED DESCRIPTION OF THE EMBODIMENTS

Figure 1:
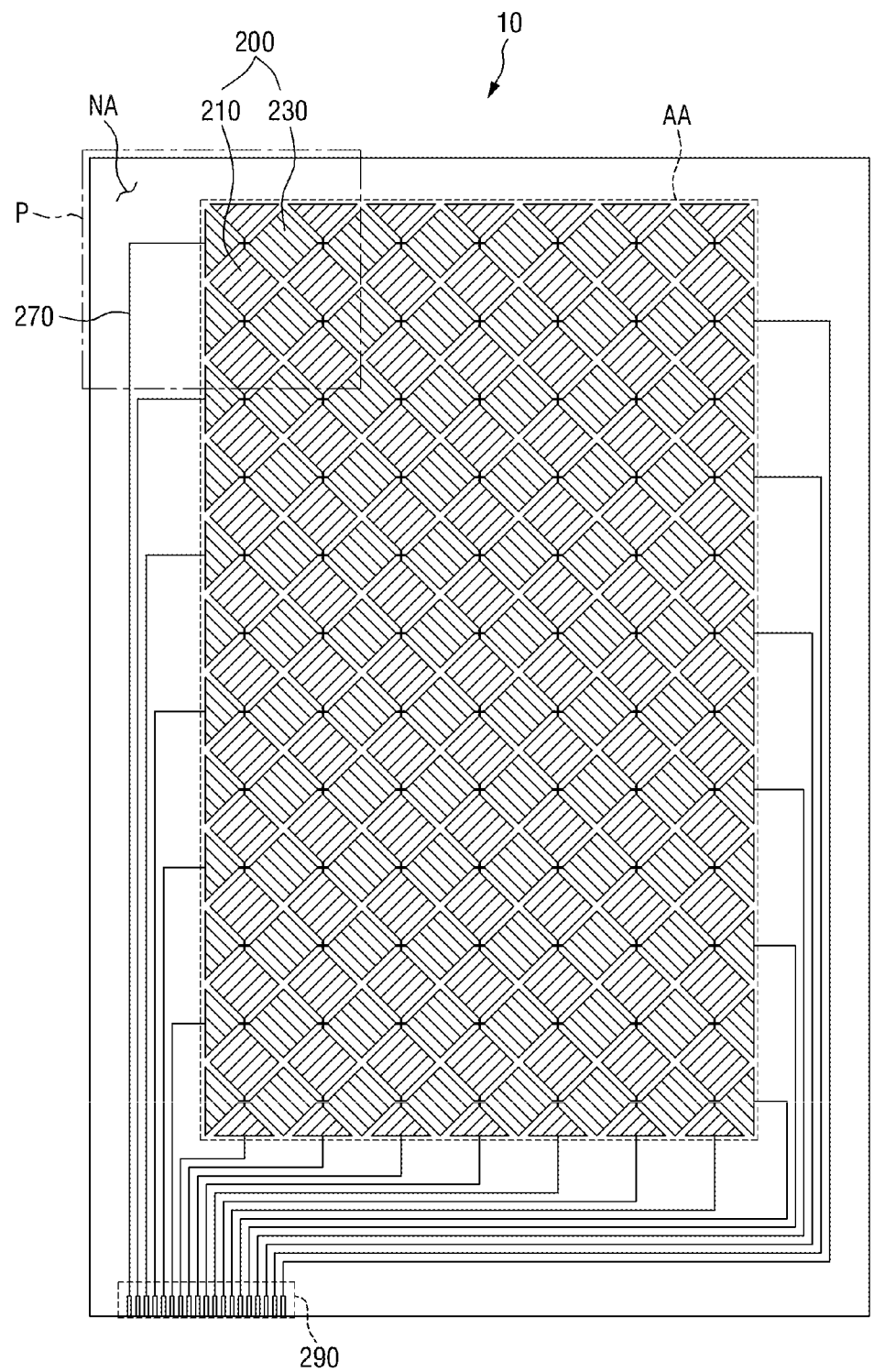
FIG. 1 is a plan view of a touch panel according to an exemplary embodiment of the inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present between the element or layer and the another element or layer. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the s particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Exemplary embodiments will hereinafter be described with reference to the accompanying drawings.

Figure 2:
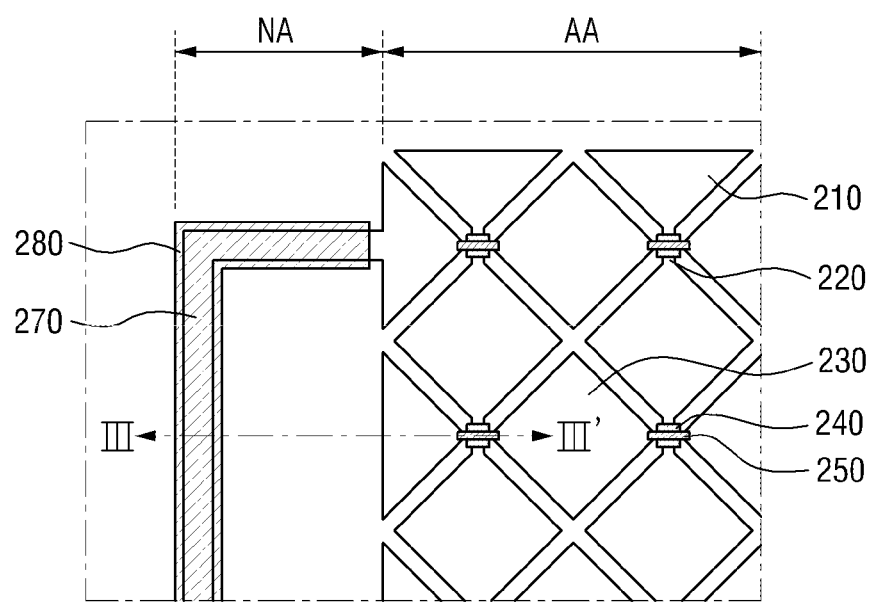
FIG. 2 is an enlarged plan view of part P of FIG. 1.
Figure 3:
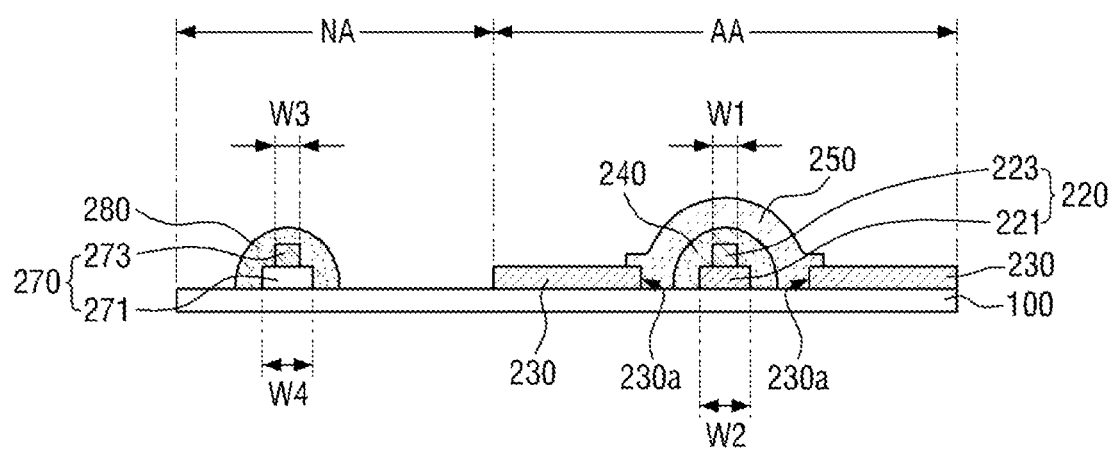
FIG. 3 is a cross-sectional view taken along line of FIG. 2.

FIG. 1 is a plan view of a touch panel according to an exemplary embodiment of the inventive concept, FIG. 2 is an enlarged plan view of part P of FIG. 1, and FIG. 3 is a cross-sectional view taken along line III-III' of FIG. 2.

Referring to FIGS. 1 to 3, a touch panel 10 may include a substrate 100, sensing electrodes 200, one or more first connectors 220, first insulating layer patterns 240, one or more second connectors 250, and wires 270.

The substrate 100 may be a transparent substrate having the sensing electrodes 200, the first connectors 220, the first insulating layer patterns 240, the second connectors 250 and the wires 270 formed on a first surface (for example, the top surface) thereof. The substrate 100 may be formed of, for example, an insulating material such as glass, plastic, silicon or a synthetic resin. The substrate 100 may be a flexible film.

The substrate 100 may include a sensing area AA and a peripheral area NA, which is a peripheral portion of the sensing area AA. The sensing area AA may be an area where the contact position of a hand or an object is sensed. The sensing electrodes 200, the first connectors 220, the first insulating layer patterns 240 and the second connectors 250 may be disposed on the first surface (for example, the top surface) of the substrate 100 in the sensing area AA.

The peripheral area NA may be an area outside the sensing area AA, or a peripheral portion of the sensing area AA. The wires 270, which are connected to the sensing electrodes 200, and a pad unit 290, which is connected to the wires 270, may be disposed on the first surface of the substrate 100 in the peripheral area NA.

A driving circuit board (not illustrated) for driving the touch panel 10 may be electrically connected to the pad unit 290.

The sensing electrodes 200 may be disposed on the first surface of the substrate 100 in the sensing area AA. The sensing electrodes 200 may include a plurality of first sensing patterns 210, which are connected in a first direction (for example, a vertical direction), and a plurality of second sensing patterns 230, which are connected in a second direction (for example, a horizontal direction).

The first sensing patterns 210 and the second sensing patterns 230 may be disposed on a level with each other. The expression "disposed on a level with each other", as used herein, means being disposed on the same layer. In some exemplary embodiments, the first sensing patterns 210 and the second sensing patterns 230 may be formed on the first surface of the substrate 100 to directly contact the substrate 100.

The first sensing patterns 210 and the second sensing patterns 230 may be formed of a light-transmitting conductive material. In some exemplary embodiments, the light-transmitting conductive material may be a transparent conductive or metal material. For example, the light-transmitting conductive material may include at least one of indium tin oxide (ITO), indium zinc oxide (IZO), silver (Ag) nanowires, gold (Au) nanowires, platinum (Pt) nanowires, copper (Cu) nanowires, and nickel (Ni) nanowires, but the inventive concept is not limited thereto.

In some exemplary embodiments, the first sensing patterns 210 and the second sensing patterns may be formed of the same material(s) by, or during, the same process.

The first sensing patterns 210, which are adjacent to one another in the first direction, may be connected to one another via the first connectors 220, which are provided on the first surface of the substrate 100.

The first connectors 220 may be disposed on the first surface of the substrate 100, and may be provide in the sensing area AA. Each of the first connectors 220 may include a first light-transmitting conductive pattern 221 and a first light-blocking conductive pattern 223, which is disposed on the first light-transmitting conductive pattern 221.

In some exemplary embodiments, the first light-transmitting conductive pattern 221 may be disposed on a level with the first sensing patterns 210 and the second sensing patterns 230, and may be formed on the first surface of the substrate 100 to directly contact the substrate 100.

The first light-transmitting conductive pattern 221, like the first sensing patterns 210 and the second sensing patterns 230, may be formed of a light-transmitting conductive material, and the light-transmitting conductive material may be a transparent conductive material or thin metal material.

In some exemplary embodiments, the first light-transmitting conductive pattern 221 may be formed of the same material(s) as the first sensing patterns 210 and the second sensing patterns 230 by, or during, the same process.

In some exemplary embodiments, the first light-transmitting conductive pattern 221 may be formed in one body with the first sensing patterns 210. In other words, the first sensing pattern 210 and the first light-transmitting conductive pattern 221 may be formed of the same material and using the same mask during a manufacturing process.

The first light-blocking conductive pattern 223 may be formed of a light-blocking conductive material. In some exemplary embodiments, the light-blocking conductive material may be an opaque low-resistance conductive material, and the low-resistance conductive material may have a lower resistance than the first sensing patterns 210 and the second sensing patterns 230. For example, the light-blocking conductive material may be molybdenum (Mo), Ag, titanium (Ti), Cu, aluminum (Al), or Mo/Al/Mo, but the inventive concept is not limited thereto.

In some exemplary embodiments, a width W1 of the first light-blocking conductive pattern 223 in the second direction (or the horizontal direction) may be smaller than a width W2 of the first light-transmitting conductive pattern 221 in the second direction. The first light-blocking conductive pattern 223 may have a lower light transmission rate, but a higher light-shielding rate than the first light-transmitting conductive pattern 221, and may thus be more likely than the first light-transmitting conductive pattern 221 to be seen from the outside. Since in the touch panel 10, the width W1 of the first light-blocking conductive pattern 223 is smaller than the width W2 of the first light-transmitting conductive pattern 221, the first light-blocking conductive pattern 223 may be prevented (or at least minimized) from being seen from the outside. However, the width W1 may be wide enough to block light from the photolithography apparatus to expose a positive photo-resistor on the first light blocking conductive pattern.

The first insulating layer patterns 240 may be disposed on, and cover, the first connectors 220. The first insulating layer patterns 240 may completely cover top and side surfaces of the first connectors 220. At least some of the first insulating layer patterns 240 may directly contact the first surface of the substrate 100 exposed between the first sensing patterns 210 and the second sensing pattern 220.

In some exemplary embodiments, the first insulating layer patterns 240 may be formed of an organic insulating material, and the organic insulating material may be a positive photosensitive resin such as positive photo-resistor. Examples of the positive photosensitive resin include binder resins, which are typical alkali-soluble resins, photosensitive agents with various structures and solvents, but the inventive concept is not limited thereto.

The second connectors 250, which intersect the first connectors 220 and electrically connect the second sensing patterns 230 that are adjacent to one another in the second direction, may be disposed on the first insulating layer patterns 240.

The second connectors 250 may be formed of a conductive material, for example, a light-transmitting conductive material or a light-blocking conductive material. The light-transmitting conductive material and the light-blocking conductive material have already been described in the description of the sensing electrodes 200 or the first light-blocking conductive pattern 223, and thus, detailed descriptions thereof will be omitted.

In some exemplary embodiments, at least some of the second connectors 250 may directly contact the first surface of the substrate 100. In a case when a plurality of second connectors 250 are provided, at least one of the second connectors 250 may directly contact side surfaces 230a of the second sensing patterns 230. That is, at least one of the first insulating layer patterns 240 may not directly contact the sides 230a of the second sensing patterns 230. Accordingly, an isolation space may exist between at least one of the first insulating layer patterns 240 and the second sensing patterns 230, and the first surface of the substrate 100 may be partially exposed to the outside. The second connectors 250 may fill the isolation space, and may thus directly contact the sides 230a of the second sensing patterns 230.

The wires 270 may be disposed on the first surface of the substrate 100 in the peripheral area NA. The wires 270 may be electrically connected to the first sensing patterns 210 and the second sensing patterns 230, respectively. In some exemplary embodiments, the wires 270 may be directly connected to at least one of the sensing electrodes 200 on an outermost edge of the sensing area.

Each of the wires 270 may include a second light-transmitting conductive pattern 271 and a second light-blocking conductive pattern 273, which is disposed on the second light-transmitting conductive pattern 271.

In some exemplary embodiments, the second light-transmitting conductive pattern 271 may be disposed on a level with the first sensing patterns 210, the first light-transmitting conductive pattern 221 and the second sensing patterns 230, and may be formed on the first surface of the substrate 100 to directly contact the substrate 100.

The second light-transmitting conductive pattern 271, like the first light-transmitting conductive pattern 221, the first sensing patterns 210 and the second sensing patterns 230, may be formed of a light-transmitting conductive material, and the light-transmitting conductive material may be a transparent conductive or metal material.

In some exemplary embodiments, the second light-transmitting conductive pattern 271 may be formed of the same material(s) as at least one of the first light-transmitting conductive pattern 221, the first sensing patterns 210 and the second sensing patterns 230. In other exemplary embodiments, the second light-transmitting conductive pattern 271 may be formed of the same material(s) as the first light-transmitting conductive pattern 221, the first sensing patterns 210 and the second sensing patterns 230, in which case, the second light-transmitting conductive pattern 271 may be formed by, or during, the same process as the first light-transmitting conductive pattern 221, the first sensing patterns 210 and the second sensing patterns 230.

The second light-blocking conductive pattern 273, like the first light-blocking conductive pattern 223, may be formed of a light-blocking conductive material. In some exemplary, embodiments, the light-blocking conductive material may be an opaque low-resistance conductive material.

In some exemplary embodiments, the second light-blocking conductive pattern 273 may be formed of the same material(s) as the first light-blocking conductive pattern 223 by, or during, the same process.

In some exemplary embodiments, a width W3 of the second light-blocking conductive pattern 273 in the second direction (or the horizontal direction) may be smaller than a width W4 of the second light-blocking conductive pattern 271 in the second direction.

The second insulating layer patterns 280 may be disposed on the wires 270 and may cover top and side surfaces of the second light-transmitting conductive pattern 271 and the second light-blocking conductive pattern 273. In some exemplary embodiments, the second insulating layer patterns 280 may completely cover the wires 270, but the inventive concept is not limited thereto. That is, the second insulating layer patterns 280 may only partially cover the wires 270.

In some exemplary embodiments, the second insulating layer patterns 280 may be formed of an organic insulating material, and the organic insulating material may be a positive photosensitive resin such as positive photo-resistor. In some exemplary embodiments, the second insulating layer patterns 280 may be formed of the same material(s) as the first insulating layer patterns 240 by the same process.

A method of fabricating the touch panel 10 will hereinafter be described.

FIGS. 4 to 17 are cross-sectional views, taken along lines III-III' of FIG. 2, illustrating a method of fabricating a touch panel, according to an exemplary embodiment of the inventive concept.

Figure 4:
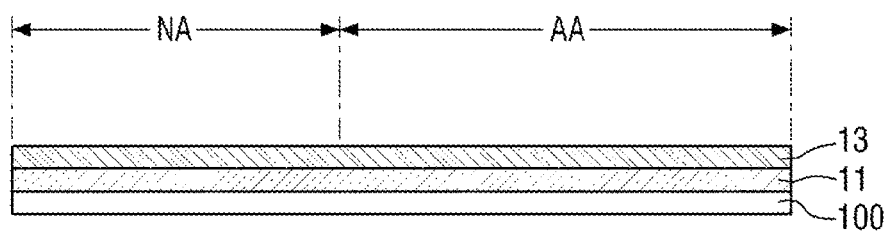
FIGS. 4, 5, 6, 7, 8, 9, 10, 11, 12, 13, 14, 15, 16 and 17 are cross-sectional views illustrating a method of fabricating a touch panel, according to an exemplary embodiment of the inventive concept.

Referring to FIG. 4, a light-transmitting conductive layer 11 and a light-blocking conductive layer 13 are sequentially formed on a first surface of a substrate 100 where a sensing area AA and a peripheral area NA are defined. The material for forming the light-transmitting conductive layer 11 is substantially identical to the light-transmitting conductive material described above with reference to FIGS. 1 to 3, and the material for forming the light-blocking conductive layer 13 is substantially identical to the light-blocking conductive material described above with reference to FIGS. 1 to 3.

Figure 5:
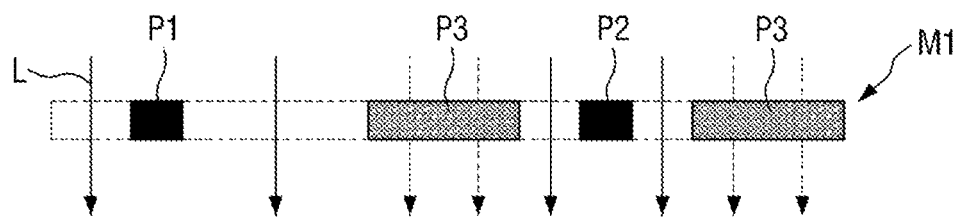
Figure 5:
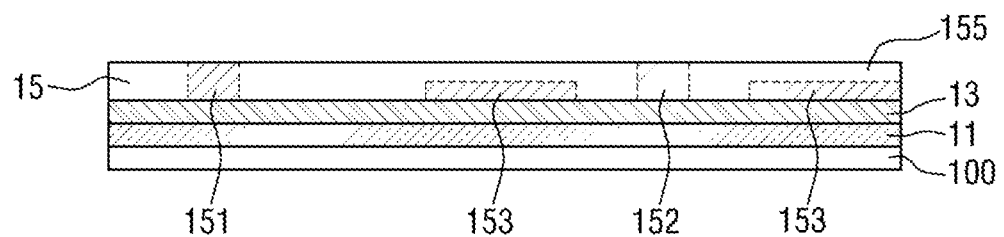
Figure 6:
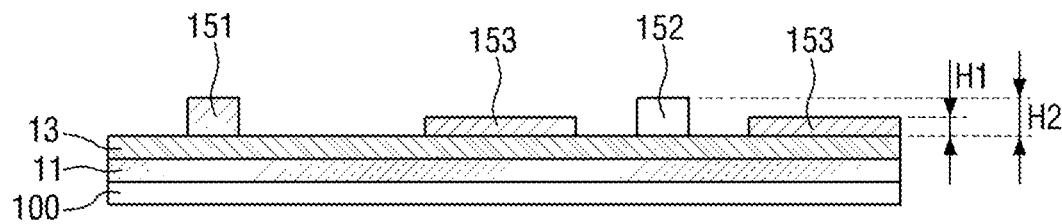

Thereafter, referring to FIG. 5, a photosensitive layer 15 is formed on the light-blocking conductive layer 13. The photosensitive layer 15 may be formed by coating a liquid-phase photoresist on the light-blocking conductive layer 13 or using dry film photoresist (DFR). The photosensitive layer 15 may be of a positive type, in which case, an exposed portion of the photosensitive layer 15 is removable by a development process, but the inventive concept is not limited thereto. That is, the photosensitive layer 15 may be of a negative type, in which case, a non-exposed portion of the photosensitive layer 15 is removable by a development process. For convenience, in the description that follows, it is assumed that the photosensitive layer 15 is of the positive type.

After the formation of the photosensitive layer 15, a first mask M1 is placed over the first surface of the substrate 100. The first mask M1 may include a first light-blocking pattern P1, which corresponds to a wire (270 of FIGS. 1 to 3), a second light-blocking pattern P2, which corresponds to a first connector (220 of FIGS. 1 to 3), and transflective patterns P3, which correspond to a first sensing pattern (210 of FIGS. 1 to 3) and a second sensing pattern (230 of FIGS. 1 to 3). The first light-blocking pattern P1 and the second light-blocking pattern P2 may completely block light used for exposure of the photosensitive layer 15, and the third light-blocking pattern P3 may partially block the light used for exposure of the photosensitive layer 15. The first mask M1 may be a half-tone mask or a phase-shift mask.

Thereafter, the photosensitive layer 15 is exposed by applying ultraviolet (UV) light L to the substrate 100 from above the substrate 100. A first portion 151 of the photosensitive layer 15, which corresponds to a region where a wire (270 of FIGS. 1 to 3) is to be formed, a second portion 152 of the photosensitive layer 15, which corresponds to a region where a first connector (220 of FIGS. 1 to 3) is to be formed, are not exposed to UV light and third portions 153 of the photosensitive layer 15, which correspond to regions where first sensing patterns (210 of FIGS. 1 to 3) and second sensing patterns (230 of FIGS. 1 to 3) are to be formed, are partially exposed.

Thereafter, an exposed portion 155 of the photosensitive layer 15 is removed by a development process. As a result, referring to FIG. 6, the first portion 151, the second portion 152 and the third portions 153 remain on the light-blocking conductive layer 13. The photosensitive layer 15 on the first portion 151 and the second portion 152 may be relatively thicker than that of the third portions 153, which are partially exposed portions of the photosensitive layer 15 that correspond to the transflective patterns P3. For example, a height H1 from the top surface of the light-blocking conductive layer 13 to the top of the third portions 153 may be smaller than a height H2 from the top surface of the light-blocking conductive layer 13 to the top of the first portion 151 or the second portion 152.

Figure 7:
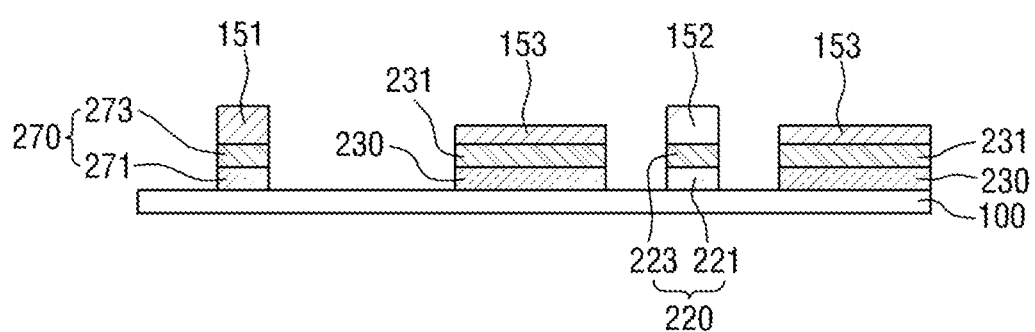
Figure 8:
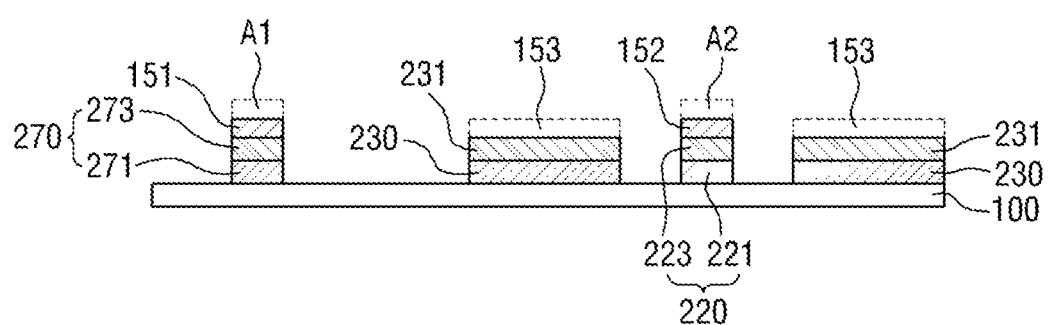

Thereafter, referring to FIG. 7, the light-blocking conductive layer 13 and the light-transmitting conductive layer is completely etched using the remaining portions of the photosensitive layer 15, i.e., the first portion 151, the second portion 152 and the third portions 153, as a mask. Thereafter, referring to FIG. 8, the top of the portions 231 of the light-blocking conductive layer 13 is exposed by removing the third portions 153, which are disposed on the second sensing patterns 230, through an ashing process. During the ashing process, part A1 of the first portion 151 and part A2 of the second portion 152 may also be removed, but the first portion 151 and the second portion 152 may still remain on the wire 270 and the first connector 220, respectively.

Figure 9:
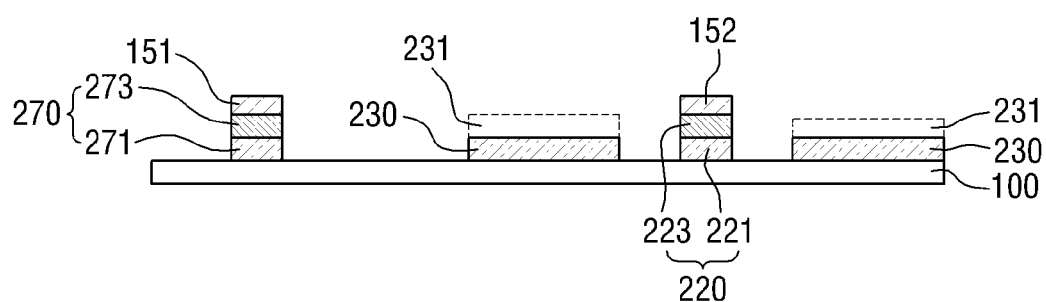

Thereafter, referring to FIG. 9, the portions 231 of the light-blocking conductive layer 13, which remain on the first sensing patterns (210 of FIGS. 1 to 3) and the second sensing patterns 230, are removed by using the first portion 151 and the second portion 152 as a mask.

Figure 10:
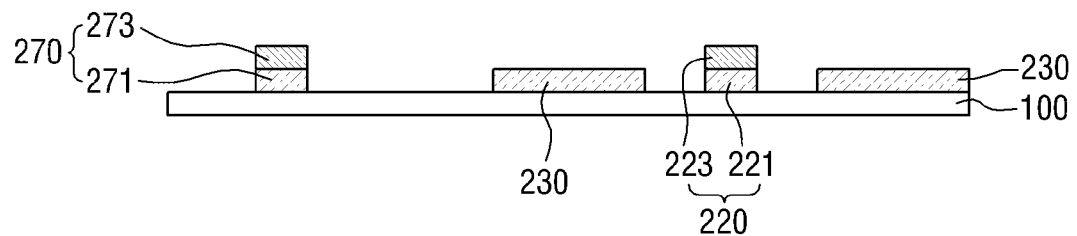

Thereafter, referring to FIG. 10, the first portion 151 and the second portion 152 may be removed by a stripping process.

Figure 11:
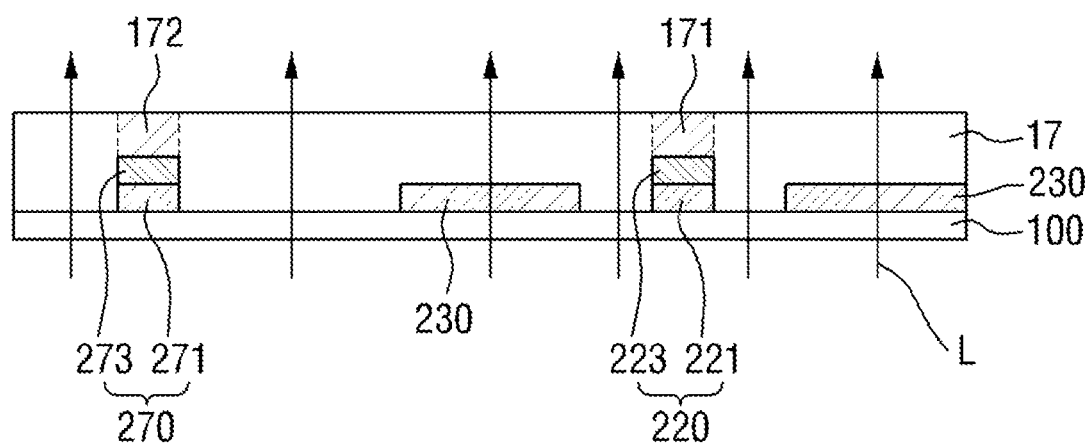
Figure 12:
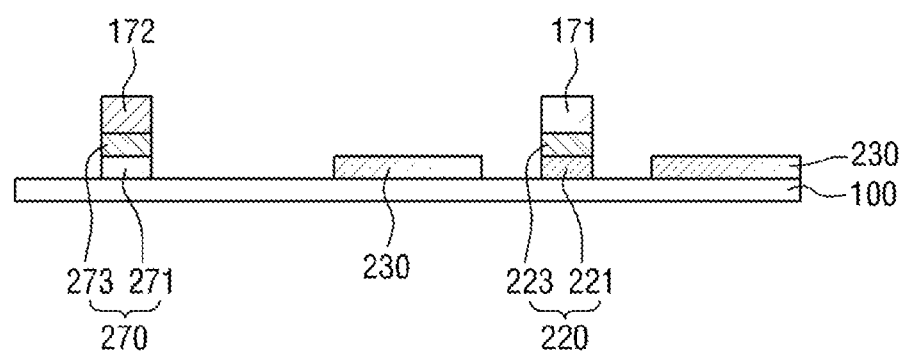

Thereafter, referring to FIG. 11, a photosensitive insulating layer 17, which covers the wire 270, the first sensing patterns (210 of FIGS. 1 to 3) and the second sensing patterns 230, is formed on the first surface of the substrate 100. The photosensitive insulating layer 17 may be formed of an organic insulating material, and the organic insulating material may be a positive photosensitive resin.

Thereafter, the photosensitive insulating layer 17 is exposed by applying UV light L to the photosensitive insulating layer 17 from a second surface (for example, the bottom surface) of the substrate 100.

Since the first connector 220 includes the first light-blocking conductive pattern 223 and the wire 270 includes the second light-blocking conductive pattern 273, a first portion 171 of the photosensitive insulating layer 17 on the first connector 220 and a second portion 172 of the photosensitive insulating layer 17 on the wire 270 are not exposed. That is, the first light-blocking conductive pattern 223 and the second light-blocking conductive pattern 273 may perform the functions of a mask.

Thereafter, an exposed portion of the photosensitive insulating layer 17 is removed by a development process. As a result, referring to FIG. 12, the first and second portions 171 and 172 of the photosensitive insulating layer 17 remain on the first connector 220 and the wire 270, respectively.

Figure 13:
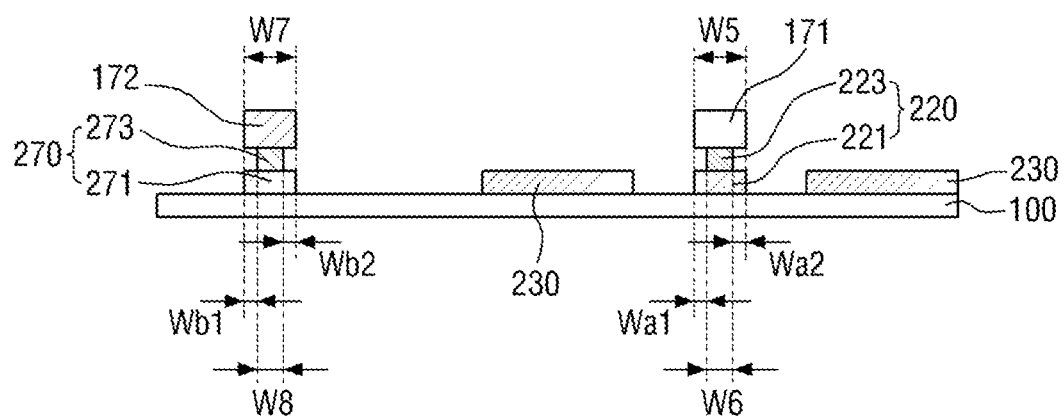

Optionally, the line widths of the first light-blocking conductive pattern 223 and the second light-blocking conductive pattern 273 may be reduced by performing an selective etching process (for example, a wet etching process) using the first and second portions 171 and 172 as a mask as disclosed in FIG. 13.

More specifically, during the etching process, both sides of the first light-blocking conductive pattern 223, which are exposed to the outside, may be etched so that the width of the first light-blocking conductive pattern 223 in a second direction (or a horizontal direction) may be reduced by amounts Wa1 and Wa2 on both sides of the first light-blocking conductive pattern 223. Accordingly, the width of the first light-blocking conductive pattern 223 in the second direction (or the horizontal direction) may be reduced from a width W5 before the etching process to a width W6 after the etching process.

As described above, in an exemplary embodiment, the line width of the first light-blocking conductive pattern 223 may be reduced by etching, and as a result, the probability of the first light-blocking conductive pattern 223 being seen from the outside may be minimized. However, the inventive concept is not limited to this exemplary embodiment. That is, in an alternative exemplary embodiment, no etching process for reducing the line widths of the first light-blocking conductive pattern 223 and the second light-blocking conductive pattern 273 may be performed.

During the etching process, both sides of the second light-blocking conductive pattern 273, which are exposed to the outside, may also be etched so that the width of the second light-blocking conductive pattern 273 in the second direction (or the horizontal direction) may be reduced by amounts Wb1 and Wb2 on both sides of the second light-blocking conductive pattern 273. Accordingly, the width of the second light-blocking conductive pattern 273 in the second direction (or the horizontal direction) may be reduced from a width W7 before the etching process to a width W8 after the etching process.

Figure 14:
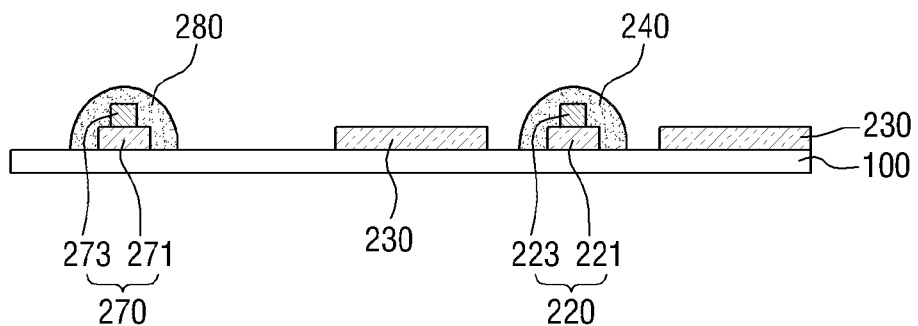
Figure 15:
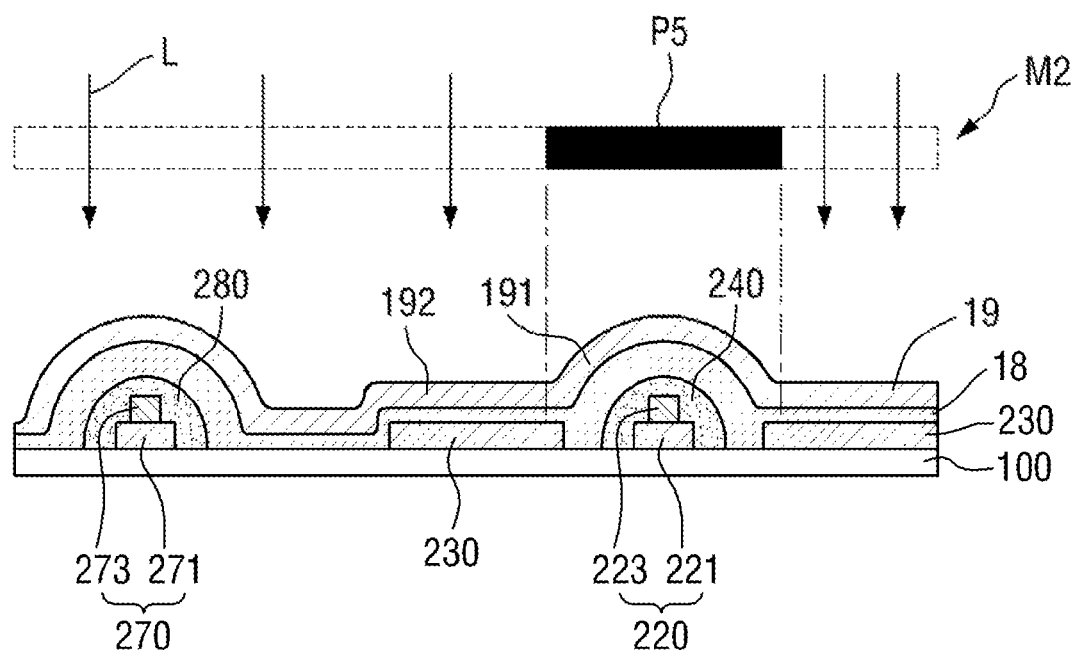

Thereafter, referring to FIG. 14, a first insulating layer pattern 240, which covers the first connector 220, and a second insulating layer pattern 280, which covers the wire 270, may be formed by thermally treating, and curing, the first and second portions 171 and 172. The first insulating layer pattern 240 and the second insulating layer pattern 280 are the same as their respective counterparts of FIGS. 1 to 3, and thus, detailed descriptions thereof will be omitted.

Thereafter, a conductive layer 18 is formed on the first sensing patterns (210 of FIGS. 1 to 3), the first connector 220, the second sensing patterns 230, the wire 270, the first insulating layer pattern 240 and the second insulating layer pattern 280, and a photosensitive layer 19 is formed on the conductive layer 18.

The conductive layer 18 may be formed of a light-transmitting conductive material or a light-blocking conductive material. The light-transmitting conductive material and the light-blocking conductive material have already been described in the description of the first sensing patterns 210 or the first light-blocking conductive pattern 223 of FIGS. 1 to 3, and thus, detailed descriptions thereof will be omitted.

The photosensitive layer 19 may be formed by coating a liquid-phase photoresist on the light-blocking conductive layer 13 or using DFR. The photosensitive layer 15 may be of a positive type, in which case, an exposed portion of the photosensitive layer 15 is removable by a development process, but the inventive concept is not limited thereto. For convenience, in the description that follows, it is assumed that the photosensitive layer 15 is of the positive type.

Thereafter, a second mask M2 is placed over the first surface of the substrate 100. The second mask M2 may have a light-blocking pattern P5, which corresponds to a second connector (250 of FIGS. 1 to 3).

Thereafter, the photosensitive layer 19 is exposed by applying UV light L to the photosensitive layer 19 from above the substrate 100. A portion 191 of the photosensitive layer 19, which corresponds to a region where the second connector (250 of FIGS. 1 to 3) is to be formed, is not exposed, and the rest of the photosensitive layer 19, i.e., a portion 192 of the photosensitive layer 19, is exposed.

Figure 16:
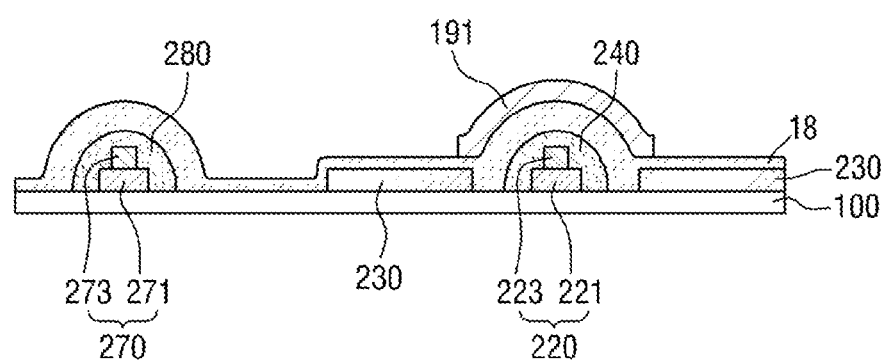
Figure 17:
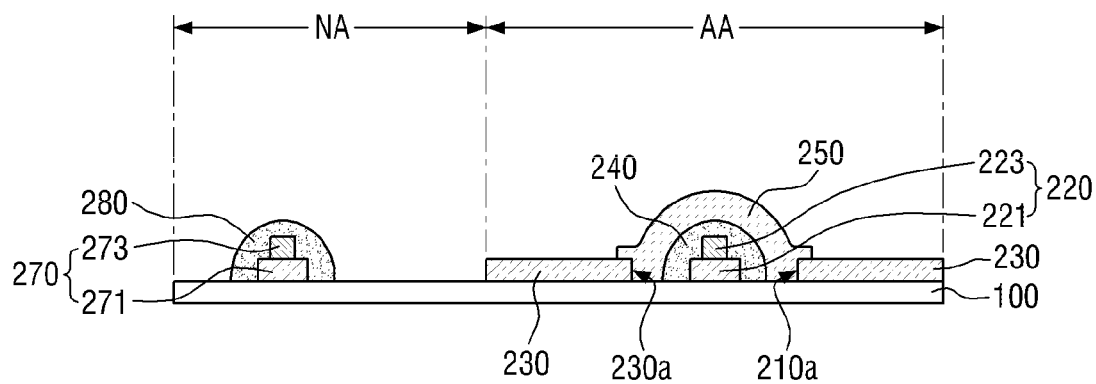

Thereafter, referring to FIG. 16, the exposed portion 192 of the photosensitive layer 19 is removed by a development process. As a result, referring to FIG. 16, the portion 191 of the photosensitive layer 19, which corresponds to the second connector (250 of FIGS. 1 to 3) remains on the conductive layer 18.

Thereafter, the conductive layer 18 is patterned using the remaining portion 191 of the photosensitive layer 19 as a mask. As a result, referring to FIG. 17, a second connector 250, which electrically connects the second sensing patterns 230 that are adjacent to each other in the second direction (or the horizontal direction), is formed.

According to the method of fabricating a touch panel, according to an exemplary embodiment of the inventive concept, the wire 270, the first sensing patterns (210 of FIGS. 1 to 3), the second sensing patterns 230, and the first and second connectors 220 and 260 can be formed by using two masks. Accordingly, the number of masks used in the manufacture of a touch panel may be reduced, and as a result, the manufacture of a touch panel may be simplified.

While the inventive concept has been particularly shown and described with reference to exemplary embodiments thereof, it will be understood by those of ordinary skill in the art that various changes may be made therein without departing from the spirit and scope of the inventive concept as defined by the following claims. The exemplary embodiments should be considered in a descriptive sense only and not for purposes of limitation.

What is claimed is:

1. A method of fabricating a touch panel, the method comprising:
    forming a light-transmitting conductive layer on a first surface of a substrate;
    forming a light-blocking conductive layer on the light-transmitting conductive layer;
    forming first sensing electrodes, which are arranged along a first direction, second sensing electrodes, which are arranged along a second direction that intersects the first direction, at least one first connector, which connects the first sensing electrodes, and wires, which are connected to the first sensing electrodes and the second sensing electrodes, by patterning the light-transmitting conductive layer and the light-blocking conductive layer;
    removing portions of the light-blocking conductive layer that are disposed on the first sensing electrodes and the second sensing electrodes;
    forming a photosensitive insulating layer, which covers the first sensing electrodes, the second sensing electrodes, the first connector and the wires, on the first surface of the substrate;
    exposing the photosensitive insulating layer using remaining unremoved portions of the light-blocking conductive layer as a mask;
    removing exposed portions of the photosensitive insulating layer;
    forming insulating layer patterns, which cover the wires and the first connector, by thermally treating remaining unremoved portions of the photosensitive insulating layer; and
    forming at least one second connector, which intersects the first connector and connects the second sensing electrodes in the second direction.

2. The method of claim 1, wherein the forming the first sensing electrodes, the second sensing electrodes, the first connector and the wires, comprises:
    forming a photosensitive layer on the light-blocking conductive layer;
    exposing the photosensitive layer using a first mask, which includes light-blocking patterns corresponding to the wires and the first connector and transflective patterns corresponding to the first sensing electrodes and the second sensing electrodes;
    removing exposed portions of the photosensitive layer; and
    patterning the light-transmitting conductive layer and the light-blocking conductive layer using remaining unremoved portions of the photosensitive layer as a mask.

3. The method of claim 2, wherein the removing the light-blocking conductive layer, comprises:
    partially exposing the light-blocking conductive layer by removing portions of the photosensitive layer that are disposed on the first sensing electrodes and the second sensing electrodes; and
    removing the exposed portions of the light-blocking conductive layer.

4. The method of claim 1, wherein the forming the second connector, comprises:
    forming a conductive layer on the entire surface of the substrate;
    forming a photosensitive layer on the conductive layer;
    exposing the photosensitive layer using a second mask, which includes a light-blocking pattern corresponding to the second connector;
    removing exposed portions of the photosensitive layer; and
    patterning the conductive layer using remaining unremoved portions of the photosensitive layer as a mask.

5. The method of claim 1, wherein the exposing the photosensitive insulating layer, comprises applying light to the photosensitive insulating layer from a second surface of the substrate.

6. The method of claim 1, wherein the light-transmitting conductive layer includes at least one of ITO, IZO, Ag nanowires, Au nanowires, Pt nanowires, Cu nanowires, and Ni nanowires.

7. The method of claim 1, wherein the light-blocking conductive layer includes at least one of Mo, Ag, Ti, Al and Cu.

8. The method of claim 1, further comprising, after the removing the exposed portions of the photosensitive insulating layer:
    wet-etching portions of the light-blocking conductive layer corresponding to the wires and the first connector using remaining unremoved portions of the photosensitive insulating layer.

9. The method of claim 1, wherein the photosensitive insulating layer is formed of a positive photosensitive resin.

* * * * *